(12) United States Patent  
Chuman et al.

(10) Patent No.: US 6,787,992 B2  
(45) Date of Patent: Sep. 7, 2004

(54) DISPLAY DEVICE OF FLAT PANEL STRUCTURE WITH EMISSION DEVICES OF MATRIX ARRAY

(75) Inventors: Takashi Chuman, Tsurugashima (JP); Takamasa Yoshikawa, Tsurugashima (JP); Takuya Hata, Tsurugashima (JP); Kazuto Sakemura, Tsurugashima (JP); Takashi Yamada, Tsurugashima (JP); Nobuyasu Negishi, Tsurugashima (JP); Shingo Iwasaki, Tsurugashima (JP); Hideo Satoh, Tsurugashima (JP); Atsushi Yoshizawa, Tsurugashima (JP); Kiyohide Ogasawara, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 45 days.

(21) Appl. No.: 10/028,994

(22) Filed: Dec. 28, 2001

(65) Prior Publication Data

US 2002/0117963 A1 Aug. 29, 2002

(30) Foreign Application Priority Data

Dec. 28, 2000  (JP) .................................. 2000-401724

(51) Int. Cl.$^7$ .............................. H01J 1/62; H01J 63/04; H01J 17/49
(52) U.S. Cl. ...................... 313/505; 313/495; 313/497; 313/500; 313/506; 313/509; 313/511; 313/519; 313/521; 313/583; 313/584; 313/587

(58) Field of Search ................................ 313/495, 497, 313/500, 505, 506, 509, 511, 519, 521, 587, 583–584, 326; 445/24–25, 50

(56) References Cited

U.S. PATENT DOCUMENTS

| | | | | |
|---|---|---|---|---|
| 2,967,248 A | * | 1/1961 | Nicoli | 250/214 LA |
| 6,066,916 A | * | 5/2000 | Osada et al. | 313/505 |
| 6,259,200 B1 | * | 7/2001 | Morita et al. | 313/498 |
| 6,545,396 B1 | * | 4/2003 | Ohki et al. | 313/309 |

* cited by examiner

Primary Examiner—Nimeshkumar D. Patel
Assistant Examiner—Matt Hodges
(74) Attorney, Agent, or Firm—Sughrue Mion, PLLC

(57) ABSTRACT

A display device has an emitting region constituted by a plurality of first electrodes provided on a substrate and extending in parallel, a plurality of second electrodes provided on the first electrodes and extending substantially perpendicularly to the first electrodes, and a plurality of emission sites for emitting electrons or light respectively connected to a plurality of intersections between the first and second electrodes and arranged on the substrate and has a peripheral region surrounding the emitting region on the substrate. In this display device, first and second groups of external repeating terminals for the first and second electrodes are collectively provided side by side in a part of the peripheral region.

35 Claims, 17 Drawing Sheets

The present invention relates to a flat panel display device.

DISPLAY DEVICE OF FLAT PANEL STRUCTURE WITH EMISSION DEVICES OF MATRIX ARRAY

BACKGROUND OF THE INVENTION

1. Field of the Invention

The present invention relates to a flat panel display device.

2. Description of the Related Art

There are merchandized products of ultra-large display systems for example a large screen multi-projection system using projection units in which plural projectors such as three CRTs or liquid crystal displays for RGB are arranged in vertical and horizontal directions. A system utilizing plural LED array panels composed flat is also available for the ultra-large display system. The former display system has a very large depth from the front thereof and therefore requires a lot of time and labor to assemble it. The latter display system involves a great difficulty in adjusting the tones and luminance of respective panels. Under such circumstances, there are attracting attentions as promising next generation ultra-large display devices e.g., units consisting of flat panel display devices such as organic electroluminescence devices, and electron emission devices such as FEDs (field emission display devices).

The organic electroluminescence device utilizes an organic compound material exhibiting electroluminescence (hereinafter also referred to as "EL") that is light-emission in response to the application of a current. Each organic EL device has a thin film made of an organic EL compound material as a light-emitting layer (hereinafter referred to as "organic light-emitting layer"). An organic EL device which can be driven with small power has a configuration in which an anode, an organic EL catalytic layer, and a metal electrode serving as a cathode are sequentially formed on a substrate. For example, an organic EL catalytic layer is a multi-layer element comprised of a single organic light-emitting layer or a medium having three-layer structure consisting of an organic hole transport layer, an organic light-emitting layer, and an organic electron transport layer or a medium having two-layer structure consisting of an organic hole transport layer and an organic light-emitting later and carrier (electrons or holes) injection layers or block layers appropriately inserted between those layers.

Flat panel display devices utilizing organic EL devices are self-emission devices having an image display array comprised of a plurality of light-emitting pixels which are organic EL devices provided in rows and columns crossing each other.

Whereas, flat panel display devices utilizing electron emission devices are known as flat type light-emitting display devices having an array of cool-cathode type electron emission sources whose cathodes are not required to be heated. Electron emission devices as electron emission sources of FEDs include devices having a metal-insulator-semiconductor (MIS) structure and devices having a metal-insulator-metal (MIM) structure.

As shown in FIG. 1, an electron emission device having the MIS structure has a diode structure in which a top electrode 15 that is a metal thin-film electrode on the top is at a positive potential Vd and in which a bottom electrode 11 that is an ohmic electrode on a backside substrate 10 of glass is at a ground potential. When the voltage Vd is applied between the bottom electrode 11 and top electrode 15 to inject electrons into an electron supply layer 12, electrons move in an insulator layer 13 toward the top electrode 15. Since a diode current Id flows and the insulator layer 13 has a high resistance, a major part of the applied electric field acts on the insulator layer 13. Some of electrons that have approached the top electrode 15 pass through the top electrode 15 because of the presence of the strong electric field to be emitted into the external vacuum. Electrons "e" emitted by the top electrode 15 of the electron emission device (emission current Ie) are accelerated by a high acceleration voltage Vc applied to a collector electrode (transparent electrode) 2 provided on a front faceplate 1 in a face-to-face relationship with the same and are collected by the collector electrode 2. When the collector electrode is coated with a luminescent material 3, visible light associated with the element will be emitted.

As shown in FIG. 2, in a matrix type flat panel display device formed in a matrix-like configuration in which top electrodes 15 and bottom electrodes 11 are orthogonal to each other, a plurality of electron emission devices having the MIS (or MIM) structure are constructed by sequentially forming a bottom electrode, a semiconductor (or metal) electron supply layer, an insulator layer, and a top electrode on a substrate in each of regions where the top and bottom electrodes intersect each other.

As shown in FIG. 3, a front-side substrate 1 has a transparent collector electrode 2 made of an indium tin oxide (so-called ITO), a tin oxide (SnO), a zinc oxide (ZnO) or the like provided therein and receives electrons emitted by electron emission devices S on the backside substrate 10. Luminescent materials 3 in R, G and B are applied to the transparent collector electrode 2.

As thus described, the pair of the backside and front-side substrates 10 and 1 are held with spacers or the like (not shown) and are sealed with a vacuum space 4 sandwiched therebetween.

The two types of electrodes, i.e., the bottom electrodes 11 and the top electrodes 15 are required on the backside substrate 10 to serve as electrodes for driving the flat panel display device utilizing electron emission devices, and those electrodes are configured to be orthogonal to each other in order to drive the devices in the form of a matrix. As a result, the top electrodes 15 and bottom electrodes 11 are extended to dispose ends thereof as pickup sections on two sides of the backside substrate 10. The electrodes are connected to the outside at the pickup sections on the two sides. Since high voltage electrodes 2 for accelerating emitted electrons are required on the front-side substrate 1 facing the backside substrate 10 in parallel therewith, pickup sections of the high voltage electrodes 2 are provided and connected to the outside on a side of the front-side substrate 1 which is not in a face-to-face relationship with the two sides on which ends of the bottom electrodes 11 and top electrodes 15 are present. Thus, an assembled FED has a configuration in which the three types of electrodes, i.e., the bottom electrodes 11, top electrodes 15, and collector electrodes 2 are picked up at the three pickup sections on the three sides.

Since three sides of panels must be used in the conventional method for picking up FED electrodes as thus described, electrode pickup sections undesirably overlap each other on three sides when they are assembled into a unit. When panels are assembled into a unit, sides of the panels must be tightly combined with each other, and measures must be taken to prevent any overlap between electrode pickup sections, which makes the assembly process very much difficult.

OBJECT AND SUMMARY OF THE INVENTION

The present invention has been conceived taking the above situation into consideration, and it is an object of the invention to provide flat panel display devices which can be combined into a unit to serve as a large display device.

A flat panel display device according to the invention comprises an emitting region constituted by a plurality of first electrodes provided on a substrate and extending in parallel, a plurality of second electrodes provided on the first electrodes and extending substantially perpendicularly to the first electrodes, and a plurality of emission devices for emitting electrons or light respectively connected to a plurality of intersections between the first and second electrodes and arranged on the substrate and comprising a peripheral region surrounding the emitting region on the substrate, characterized in that the first and second electrodes and a group of second external repeating terminals are collectively arranged side by side in a part of the peripheral region.

In one aspect of the flat panel display device according to the invention, said first external repeating terminals are ends of said first electrodes and wherein said second external repeating terminals are respectively connected to said second electrodes in said emitting region and are provided side by side along said first external repeating terminals.

In another aspect of the flat panel display device according to the invention, said first external repeating terminals and said second external repeating terminals are alternately provided side by side.

In a further aspect of the flat panel display device according to the invention, said substrate is a backside substrate; said first electrodes are bottom electrodes; said emission devices are electron emission devices having insulator layers formed on said bottom electrodes and top electrodes; and said second electrodes are connected to said top electrodes, the display device comprising a transparent front-side substrate which faces said top electrodes of said electron emission devices on said backside substrate with a vacuum space sandwiched therebetween.

In a still further aspect of the flat panel display device according to the invention, said electron emission devices have electron supply layers constituted by a metal or semiconductor provided between said bottom electrodes and said insulator layers.

In another aspect of the flat panel display device according to the invention, said front-side substrate has collector electrodes formed on a surface thereof toward said vacuum space and luminescent layers formed on said collector electrodes.

In a further aspect of the flat panel display device according to the invention, said front-side substrate has luminescent layers formed on a surface thereof toward said vacuum space and collector electrodes formed on said luminescent layers.

In a still further aspect of the flat panel display device according to the invention, the device further comprises insulating protective films provided between said second electrodes and said insulator layers and between said second electrodes and said backside substrate.

In another aspect of the flat panel display device according to the invention, the device further comprises insulating protective films provided between said first electrodes and said second electrodes at intersections between said first electrodes and said second electrodes.

In a further aspect of the flat panel display device according to the invention, said emission devices are organic electroluminescence devices having one or more layers of an organic electroluminescence medium sequentially formed between said first and second electrodes.

In a still further aspect of the flat panel display device according to the invention, said substrate and said first electrodes are transparent.

In another aspect of the flat panel display device according to the invention, said first electrodes comprise a plurality of transparent electrodes associated with each of said organic electroluminescence devices and a metal bus line for electrically connecting said transparent electrodes.

In a further aspect of the flat panel display device according to the invention, said second electrodes are transparent.

In a still further aspect of the flat panel display device according to the invention, said emitting region is in a rectangular configuration and wherein the first and second external repeating terminals collectively provided side by side in a part of said peripheral region are located on one side of said rectangle.

In another aspect of the flat panel display device according to the invention, said first and second external repeating terminals have an external terminal exposed to the outside.

DETAILED DESCRIPTION OF THE PREFERRED EMBODIMENTS

A flat panel display device according to an embodiment of the invention will now be described with reference to the drawings.

Figure 1:
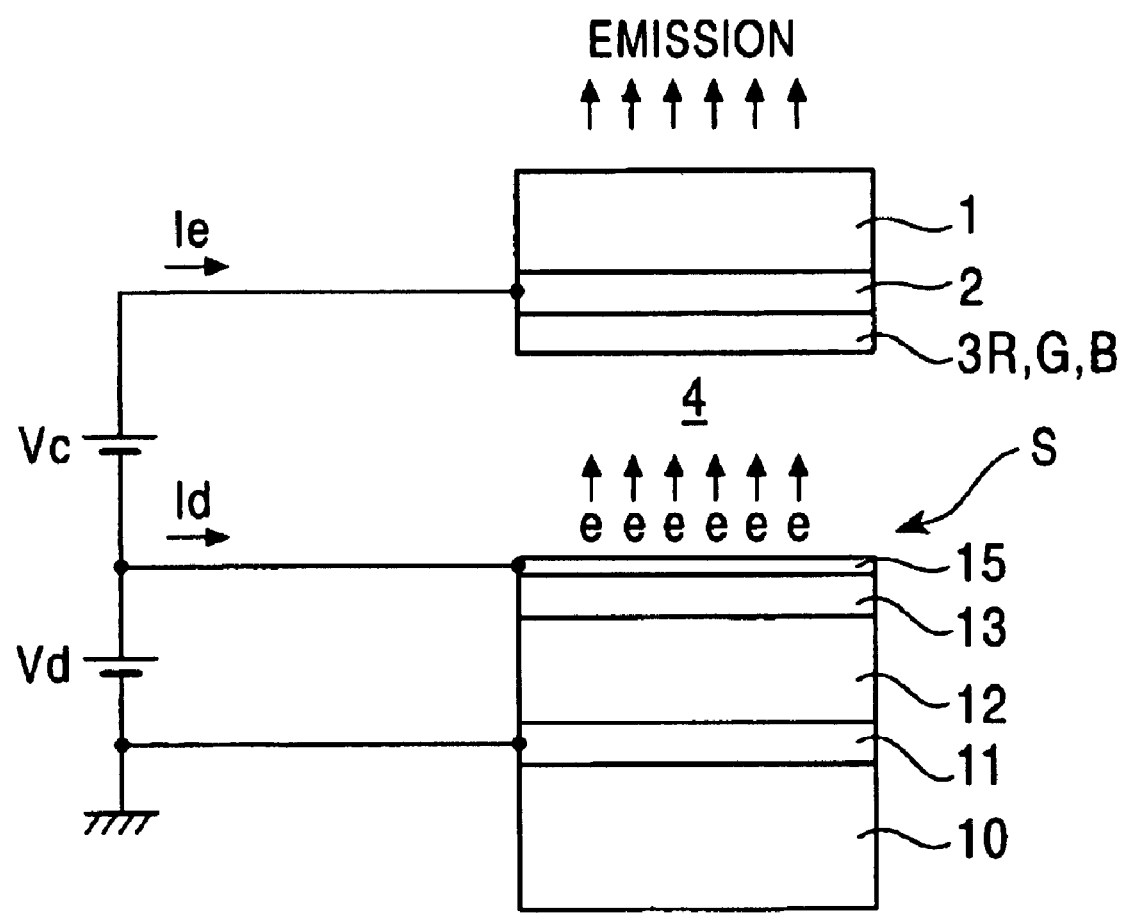
FIG. 1 is a schematic sectional view for explaining an electron emission device.
Figure 2:
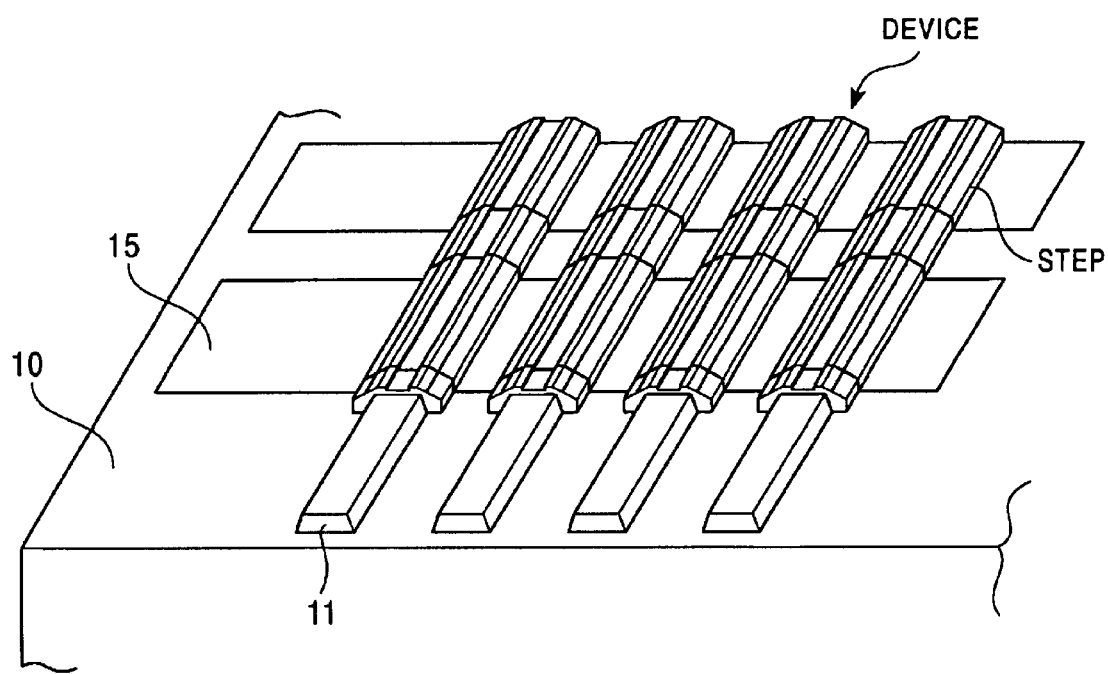
FIG. 2 is an enlarged schematic perspective view of a part of a matrix type flat panel display device utilizing electron emission devices.
Figure 3:
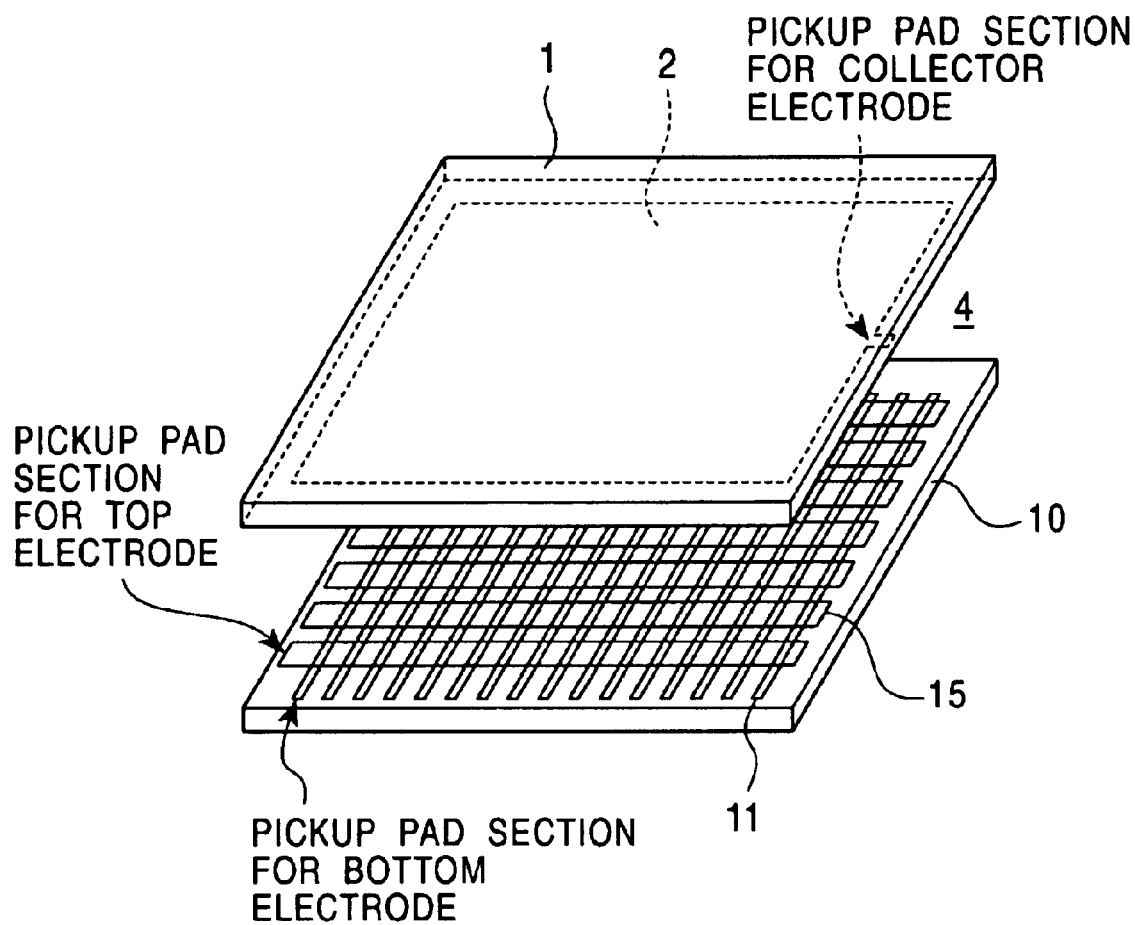
FIG. 3 is a schematic perspective view of the matrix type flat panel display device utilizing electron emission devices.
Figure 4:
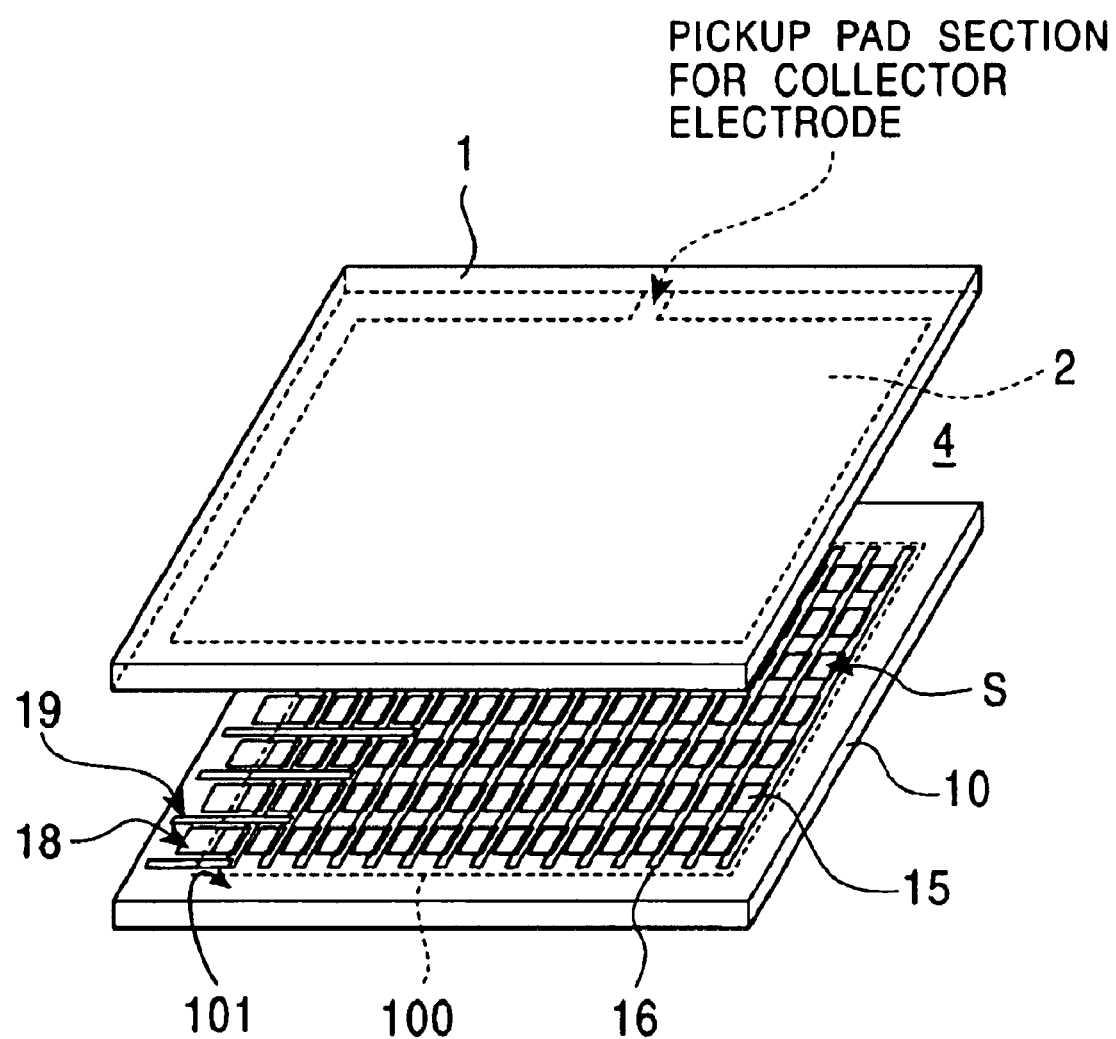
FIG. 4 is a schematic perspective view of a flat panel display device utilizing electron emission devices according to the invention.

As shown in FIG. 4, a flat panel display device utilizing electron emission devices or sites according to an embodiment of the invention has a pair of a backside substrate 10 and a transparent front-side substrate 1 which face each other with a vacuum space sandwiched therebetween. The front-side substrate having collector electrodes 2 provided on an inner surface thereof is provided such that it faces top electrodes 15 of electron emission sites on the backside substrate 10 with the vacuum space sandwiched therebetween. A rectangular emitting region 100 and a peripheral region 101 surrounding the same are provided on an inner surface of the backside substrate 10 of the flat panel display device. A predetermined luminescent material (not shown) is applied to the collector electrodes 2 on the front-side substrate 1.

The emitting region 100 includes a plurality of bottom electrodes (not shown) extending in parallel, a plurality of bus electrodes 16 provided on the bottom electrodes and extending substantially perpendicularly to the same, and a plurality of electron emission sites S respectively connected to regions in the vicinity of intersections between the bottom electrodes and bus electrodes 16. Therefore, the plurality of electron emission sites S are arranged on the backside substrate 10 such that the top electrodes 15 facing the vacuum space form a matrix array. An electron emission site S has an insulator layer (not shown) formed on the bottom electrode and a top electrode 15, and a bus electrode 16 is connected to the top electrode 15.

A plurality of first external repeating terminals 18 that are extensions of the bottom electrodes are collectively arranged side by side on one side of the peripheral region 101 of the backside substrate 10. A plurality of second external repeating terminals 19 are respectively connected to the bus electrodes 16 in the emitting region 100 and are arranged side by side along the first external repeating terminals 18. The first and second external repeating terminals 18 and 19 extend in the same direction from one side of the emitting region 100. The first and second external repeating terminals 18 and 19 serve as external terminals such as pickup sections or wiring pads when they are exposed.

Figure 5:
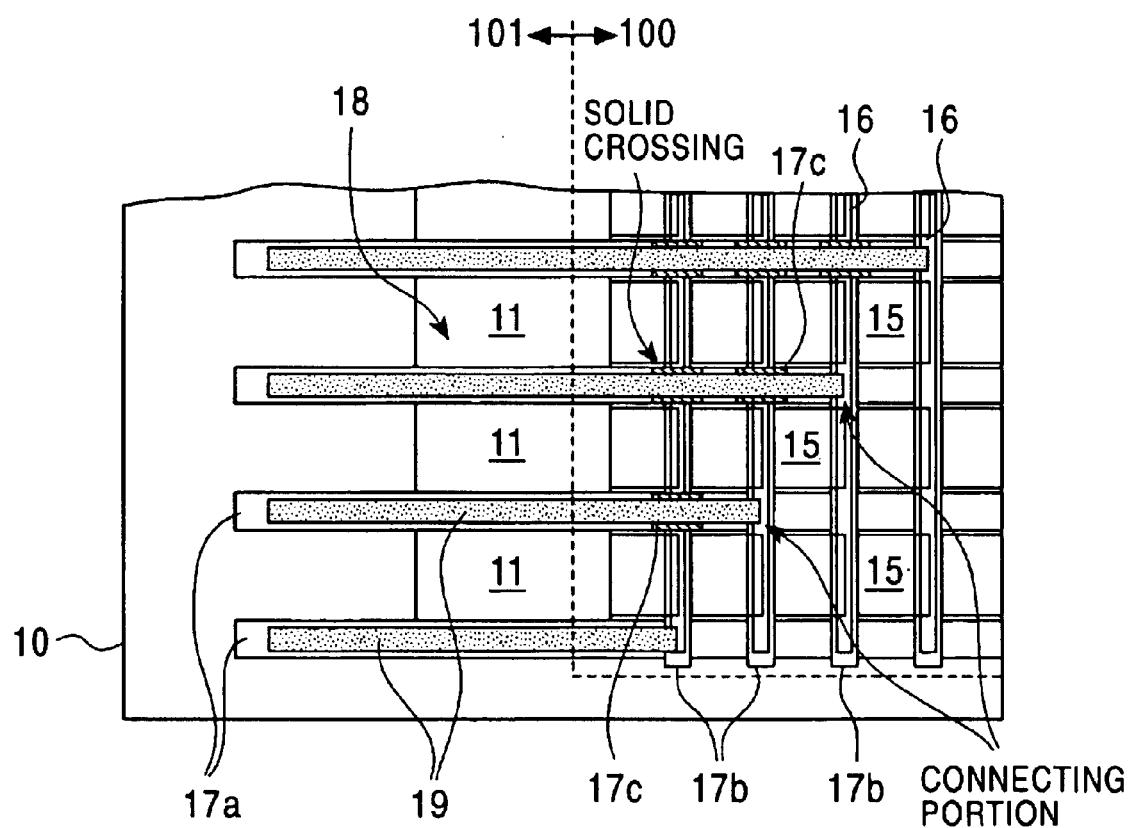
FIG. 5 is a schematic plan view of the flat panel display device utilizing electron emission devices according to the invention.

As shown in FIG. 5, a second external repeating terminal 19 branches from the bus electrode 16 on each line connected to the top electrode 15 to form the letter "T" between bottom electrodes 11, and it is picked up from the panel at a pickup section of a bottom electrode 11 or a region close to a first external repeating terminal 18.

The flat panel display device has a configuration in which second insulating protective films 17b are provided under the bus electrodes 16 and first insulating protective films 17a are also provided under the second external repeating terminals 19 to prevent them from shorting with the bottom electrodes 11.

As shown in FIG. 5, a third insulating protective film 17c is provided separately from the first and second insulating protective films 17a and 17b under a second external repeating terminal 19 which intersects with any bus electrode 16 that should not be connected in order to prevent it from shorting with the bus electrode 16. As a result of the presence of the third insulating protective film 17c, the intersection between the bus electrode 16 and the second external repeating terminal 19 which should not be connected becomes a solid crossing.

Figure 6:
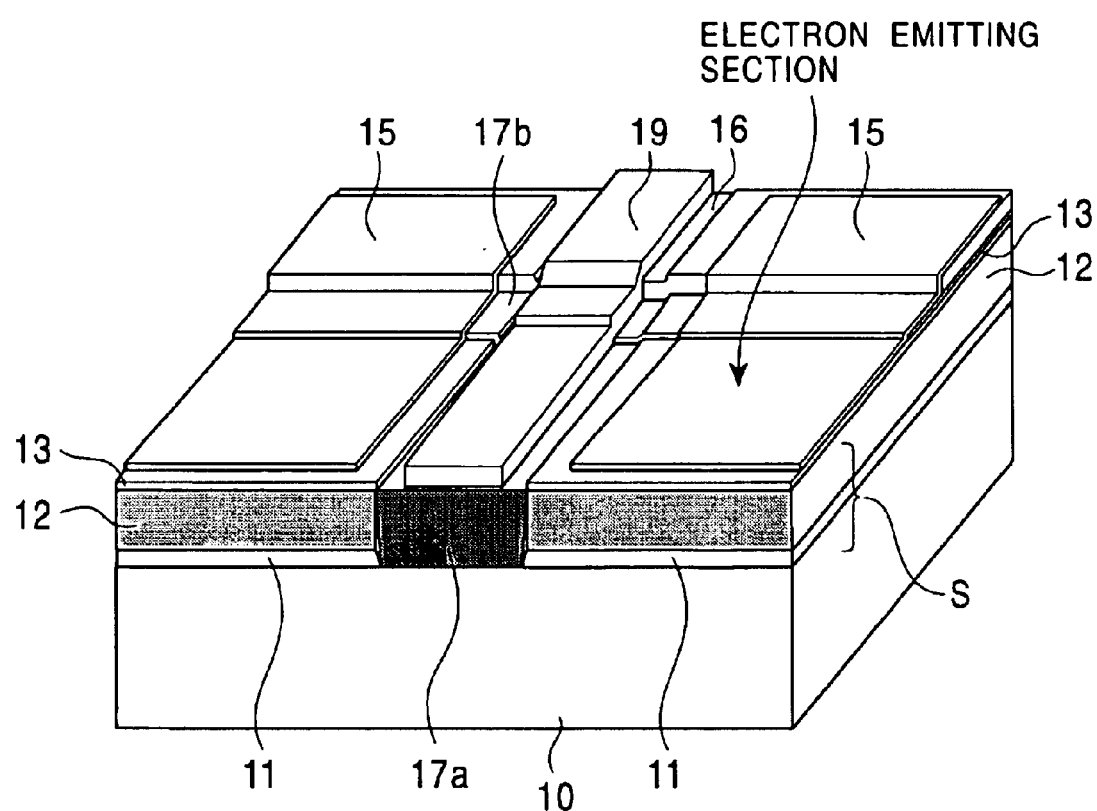
FIGS. 6 through 8 are schematic perspective views partly enlarged each showing a part of a flat panel display device utilizing electron emission devices according to the invention.
Figure 7:
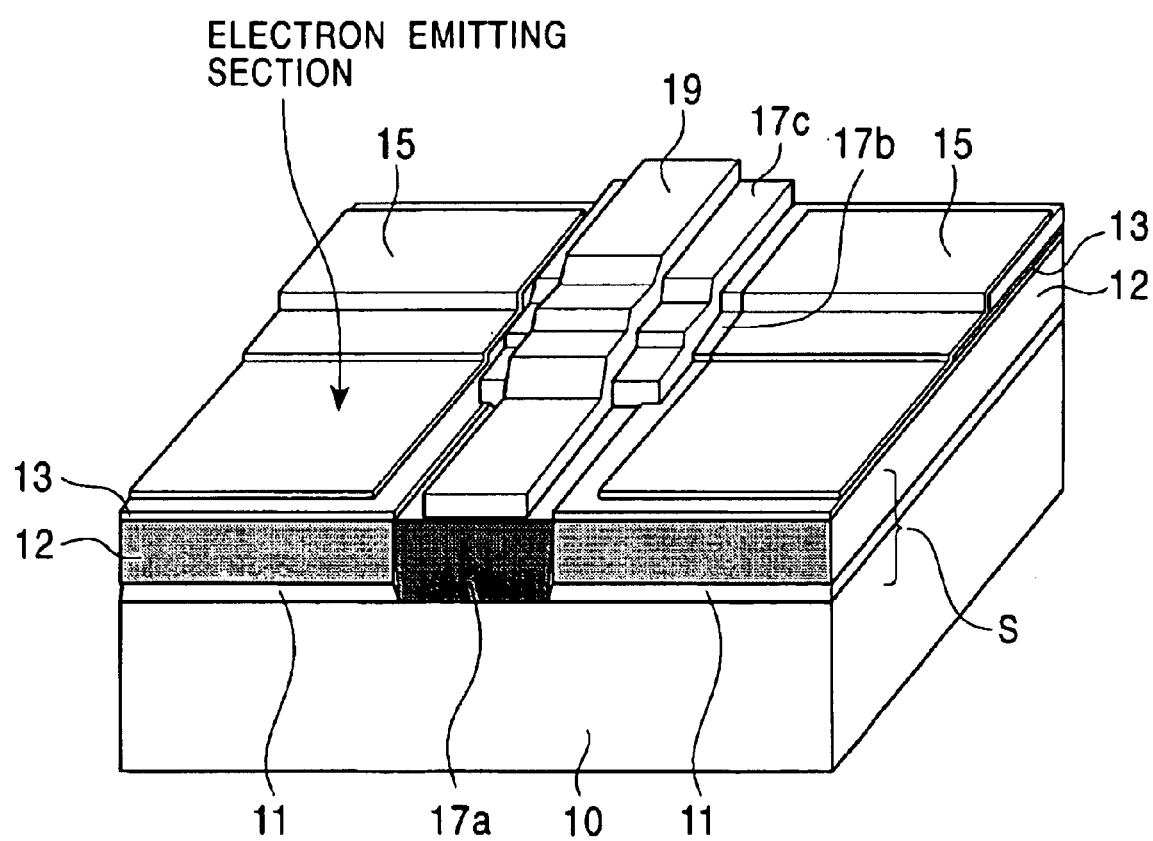
Figure 8:
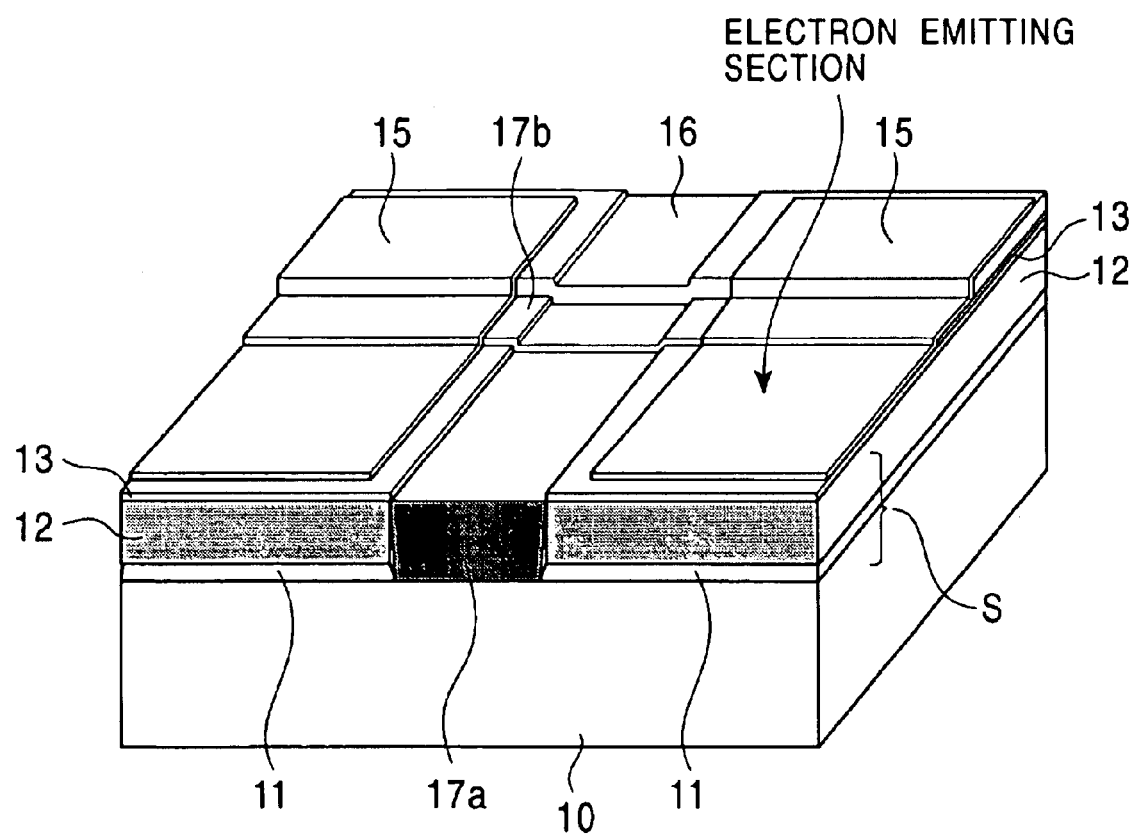

FIG. 6 shows a connecting a region or a connecting section where a second external repeating terminal 19 branches from a bus electrode 16 in the form of the letter "T". FIG. 7 shows a solid crossing between a second external repeating terminal 19 and a bus electrode 16. FIG. 8 shows a connecting section between a second external repeating terminal 19 and a bus electrode 16 and an intersection between a bottom electrode 11 and the bus electrode 16. As illustrated, a first insulating protective film 17a under the second external repeating terminal 19 is formed such that it extends to cover at least a precipice portion in a part of the bottom electrode 11. Therefore, each electron emission site S formed by an electron supply layer 12, an insulator layer 13, and a top electrode 15 sequentially formed on a bottom electrode 11 is independently formed on a surface of the backside substrate 10 on the side of the vacuum space.

The bus electrodes 16 are formed such that each of them extends on the second insulating protective films 17b to independently establish electrical connection between adjoining top electrodes 15. The bus electrodes 16 are provided over the first insulating protective films 17a and second insulating protective films 17b such that they are not in contact with the backside substrate 10.

As illustrated, the top electrodes 15 formed on the insulator layer 13 are formed only in flat regions of the insulator layer at spaces associated with sub-pixels. The top electrodes 15 are formed on the flat surfaces of the insulator layer 13 with a uniform thickness without shaping the top electrodes themselves in the form of stripes. This makes it possible to generate a uniform electric field when they are driven. The connecting section (precipice portion) of each top electrode 15 is formed on the bus electrode 16 which is sufficiently thick. The bus electrode 16 connects the top electrodes 15 of adjoining devices. While the bus electrode 16 is formed to cross a precipice portion that is formed because of the thickness of a bottom electrode, a semiconductor electron supply layer, and an insulator layer, since a sufficiently thick first insulating protective film 17a is provided under the bus electrode 16, any shorting between the electrode and the bottom electrode 11 or semiconductor electron supply layer 12 is prevented. The thickness of the bus electrodes 16 relative to the panel size may be any value as long as no problem associated with resistance occurs, a preferable thickness ranging from 0.1 to 50 $\mu$m. The first insulating protective film 17a under the bus electrodes 16 may be provided before or after the insulator layer 13 at the pixel region is formed. The insulating protective films 17a make it possible to provide a device structure in which the bus electrodes 16 are not damaged because of the presence of the precipice.

While layers of Cr, Cu and Cr are used as materials for the bus electrodes, it is not limited to use such materials, and any metal such as Pt, Au, W, Ru, Ir, Al, Sc, Ti, V, Mn, Fe, Co, Ni, Zn, Ga, Y, Zr, Nb, Mo, Tc, Rh, Pd, Ag, Cd, Ln, Sn, Ta, Re, Os, Ti, Pb, La, Ce, Pr, Nd, Pm, Sm, Eu, Gd, Tb, Dy, Ho, Er, Tm, Yb or Lu may be used alone. Alternatively, any compound or layers of such metals may be used.

It is not limited to form the bus electrodes such that they contact one end of the top electrodes 15 (pixel region) as illustrated, and they may be formed to surround the top electrodes 15. The second insulating protective films under the bus electrodes 16 may be also formed to surround the top electrodes 15.

Silicon oxide $SiO_x$ (wherein subscribed x represents an atomic ratio) is effective as the dielectric material of the first, second, and third insulating protective films 17a, 17b, and 17c and, metal oxides or metal nitrides such as $LiO_x$, $LiN_x$, $NaO_x$, $KO_x$, $RbO_x$, $CsO_x$, $BeO_x$, $MgO_x$, $MgN_x$, $CaO_x$, $CaN_x$, $SrO_x$, $BaO_x$, $ScO_x$, $YO_x$, $YN_x$, $LaO_x$, $LaN_x$, $CeO_x$, $PrO_x$, $NdO_x$, $SmO_x$, $EuO_x$, $GdO_x$, $TbO_x$, $DyO_x$, $HoO_x$, $ErO_x$, $TmO_x$, $YbO_x$, $LuO_x$, $TiO_x$, $TiN_x$, $ZrO_x$, $ZrN_x$, $HfO_x$, $HfN_x$, $ThO_x$, $VO_x$, $VN_x$, $NbO_x$, $NbN_x$, $TaO_x$, $TaN_x$, $CrO_x$, $CrN_x$, $MoO_x$, $MoN_x$, $WO_x$, $WN_x$, $MnO_x$, $ReO_x$, $FeO_x$, $FeN_x$, $RuO_x$, $OsO_x$, $CoO_x$, $RhO_x$, $IrO_x$, $NiO_x$, $PdO_x$, $PtO_x$, $CuO_x$, $CuN_x$, $AgO_x$, $AuO_x$, $ZnO_x$, $CdO_x$, $HgO_x$, $BO_x$, $BN_x$, $AlO_x$, $AlN_x$, $GaO_x$, $GaN_x$, $InO_x$, $SiN_x$, $GeO_x$, $SnO_x$, $PbO_x$, $PO_x$, $PN_x$, $ASO_x$, $SbO_x$, $SeO_x$, $TeO_x$ and the like can be used as well.

Furthermore, metal complex oxides such $LiAlO_2$, $Li_2SiO_3$, $Li_2TiO_3$, $Na_2Al_{22}O_{34}$, $NaFeO_2$, $Na_4SiO_4$, $K_2SIO_3$, $K_2TiO_3$, $K_2WO_4$, $Rb_2CrO_4$, $Cs_2CrO_4$, $MgAl_2O_4$, $MgFe_2O_4$, $MgTiO_3$, $CaTiO_3$, $CaWO_4$, $CaZrO_3$, $SrFe_{12}O_{19}$, $SrTiO_3$, $SrZrO_3$, $BaAl_2O_4$, $BaFe_{12}O_{19}$, $BaTiO_3$, $Y_3Al_5O_{12}$, $Y_3Fe_5O_{12}$, $LaFeO_3$, $La_3Fe_5O_{12}$, $La_2Ti_2O_7$, $CeSnO_4$, $CeTiO_4$, $Sm_3Fe_5O_{12}$, $EuFeO_3$, $Eu_3Fe_5O_{12}$, $GdFeO_3$, $Gd_3Fe_5O_{12}$, $DyFeO_3$, $Dy_3Fe_5O_{12}$, $HoFeO_3$, $Ho_3Fe_5O_{12}$, $ErFeO_3$, $Er_3Fe_5O_{12}$, $Tm_3Fe_5O_{12}$, $LuFeO_3$, $Lu_3Fe_5O_{12}$, $NiTiO_3$, $Al_2TiO_5$, $FeTiO_3$, $BaZrO_3$, $LiZrO_3$, $MgZrO_3$, $HfTiO_4$, $NH_4VO_3$, $AgVO_3$, $LiVO_3$, $BaNb_2O_6$, $NaNbO_3$, $SrNb_2O_6$, $KTaO_3$, $NaTaO_3$, $SrTa_2O_6$, $CuCr_2O_4$, $Ag_2CrO_4$, $BaCrO_4$, $K_2MoO_4$, $Na_2MoO_4$, $NiMoO_4$, $BaWO_4$, $Na_2WO_4$, $SrWO_4$, $MnCr_2O_4$, $MnFe_2O_4$, $MnTiO_3$, $MnWO_4$, $CoFe_2O_4$, $ZnFe_2O_4$, $FeWO_4$, $CoMoO_4$, $CoTiO_3$, $CoWO_4$, $NiFe_2O_4$, $NiWO_4$, $CuFe_2O_4$, $CuMoO_4$, $CuTiO_3$, $CuWO_4$, $Ag_2MoO_4$, $Ag_2WO_4$, $ZnAl_2O_4$, $ZnMoO_4$, $ZnWO_4$, $CdSnO_3$, $CdTiO_3$, $CdMoO_4$, $CdWO_4$, $NaAlO_2$, $MgAl_2O_4$, $SrAl_2O_4$, $Gd_3Ga_5O_{12}$, $InFeO_3$, $MgIn_2O_4$, $Al_2TiO_5$, $FeTiO_3$, $MgTiO_3$, $NaSiO_3$, $CaSiO_3$, $ZrSiO_4$, $K_2GeO_3$, $Li_2GeO_3$, $Na_2GeO_3$, $Bi_2Sn_3O_9$, $MgSnO_3$, $SrSnO_3$, $PbSiO_3$, $PbMoO_4$, $PbTiO_3$, $SnO_2$—$Sb_2O_3$, $CuSeO_4$, $Na_2SeO_3$, $ZnSeO_3$, $K_2TeO_3$, $K_2TeO_4$, $Na_2TeO_3$, $Na_2TeO_4$ and the like can be used as well, and still furthermore, sulfides such as FeS, $Al_2S_3$, MgS, ZnS and the like, fluorides such as LiF, $MgF_2$, $SmF_3$ and the like, chlorides such as HgCl, $FeCl_2$, $CrCl_3$ and the like, bromides such as AgBr, CuBr, $MnBr_2$ and the like, iodide such as $PbI_2$, CuI, $FeI_2$ and the like and metal oxidized nitrides such as SiAlON and the like can be used as well for dielectric material of the insulator layer 13.

Ceramics such as Al2O3, Si3N4 and BN an the like may be used for the material of the backside substrate 10 instead of glass. The layers of Cr, Cu and Cr are used as materials for the bottom electrode 11, it is not limited to use such materials, and any metal such as Pt, Au, W, Ru, Ir, Al, Sc, Ti, V. Mn, Fe, Co, Ni, Zn, Ga, Y, Zr, Nb, Mo, Tc, Rh, Pd, Ag, Cd, Ln, Sn, Ta, Re, Os, Tl, Pb, La, Ce, Pr, Nd, Pm, Sm, Eu, Gd, Tb, Dy, Ho, Er, Tm, Yb or Lu may be used alone. Alternatively, any compound or layers of such metals may be used. Metals Pt, Au, W, Ru and Ir are effective as the material for the top electrode 15 on the electron emission side. In addition, Al, Sc, Ti, V, Cr, Mn, Fe, Go, Ni, Cu, Zn, Ga, Y, Zr, Nb, Mo, Tc, Rh, Pd, Ag, Cd, Ln, Sn, Ta, Re, Os, Tl, Pb, La, Ce, Pr, Nd, Pm, Sm, Eu, Gd, Tb, Dy, Ho, Er, Tm, Yb, Lu and the like can be used as well for the thin-film top electrode 15.

Amorphous silicon (so-called a-Si) is an advantageous material for the electron supply layers 12 of the electron emission sites. Further particularly the hydrogenated amorphous silicon (so-called a-Si:H) in which almost of the dangling bonds of a-Si are terminated by hydrogen atoms is effective for the electron supply layers 12. In addition, hydrogenated amorphous silicon carbide (so-called a-SiC:H) in which parts of Si atoms are replaced by carbon atoms (C) is also effectively used for the electron-supply layer 12. Moreover hydrogenated amorphous silicon nitride (so-called a-SiN:H) in which parts of Si atoms are replaced by nitrogen atoms (N) may be also effectively used for the electron-supply layer 12. In addition, silicon doped with boron and/or antimony may be used for the electron-supply layer 12.

$SiO_x$ is used as a dielectric material for the insulator layer 13. Moreover, materials such as metal oxides or metal nitrides, metal complex oxides, sulfides, halides, or metal oxidized nitrides used for the dielectric material of the first, second and third insulating protective films 17a, 17b, and 17c are effective for the insulator layer 13. Still further, carbon such as diamond, Fullerene ($C_{2n}$), carbon nano-tube and the like or metal carbide such as $Al_4C_3$, $B_4C$, $CaC_2$, $Cr_3C_2$, $Mo_2C$, MoC, NbC, SiC, TaC, TiC, VC, $W_2C$, WC, ZrC and the like are also effective as the dielectric material of the insulator layer 13. Fullerene ($C_{2n}$) consists of carbon atoms. The representative $C_{60}$ is a spherical surface basket molecule as known a soccer ball molecule. There is also known $C_{32}$ to $C_{960}$ and the like. The subscribed x in $O_x$, $N_x$ and the like in the above chemical formulas represent atomic ratios and also herein after. The film thickness of the insulator layer 13 may be 50 nm or greater preferably in ranging from 100 to 1000 nm.

Although sputtering is particularly effective in the fabrication of those layers and the substrate, vacuum deposition, CVD (Chemical Vapor Deposition), laser ablation, MBE (Molecular Beam Epitaxy) and ion beam sputtering are also effective.

Steps of manufacturing a flat panel display device utilizing electron emission sites will now be described.

Figure 9:
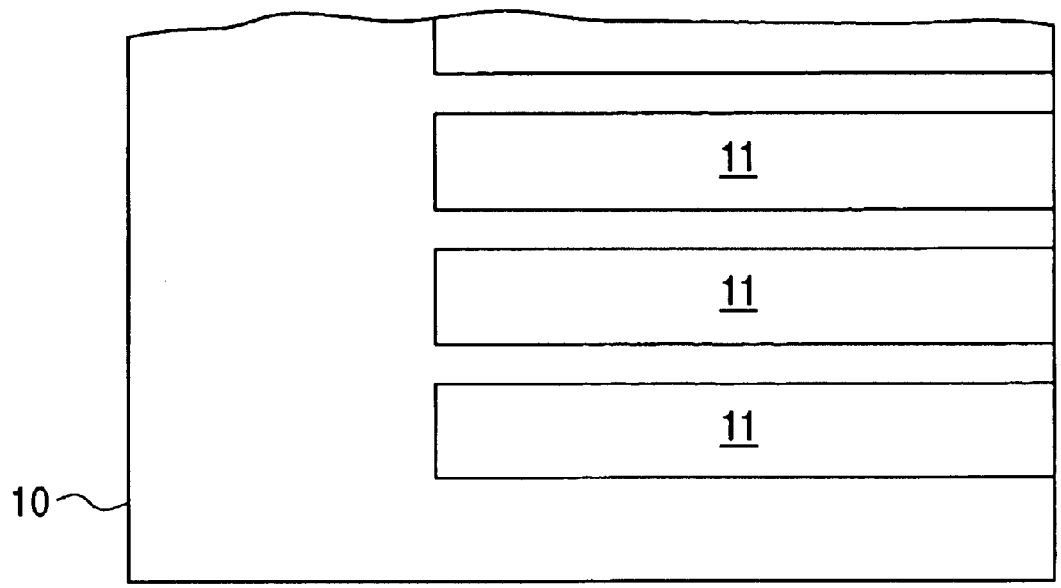
FIGS. 9 through 16 are schematic plan views each showing a part of a substrate at steps of manufacturing a flat panel display device utilizing electron emission devices according to an embodiment of the invention.

As shown in FIG. 9, a plurality of bottom electrodes 11 in the form of stripes are formed in parallel on a glass substrate 10 which has been cleaned. Referring to the method of forming the electrodes, they may be formed only in bottom electrode forming regions using a mask, for example. Alternatively, a method may be employed in which an electrode film is formed on the entire surface of a substrate and in which the film is then etched in various ways using a mask to leave only bottom electrode regions.

Figure 10:
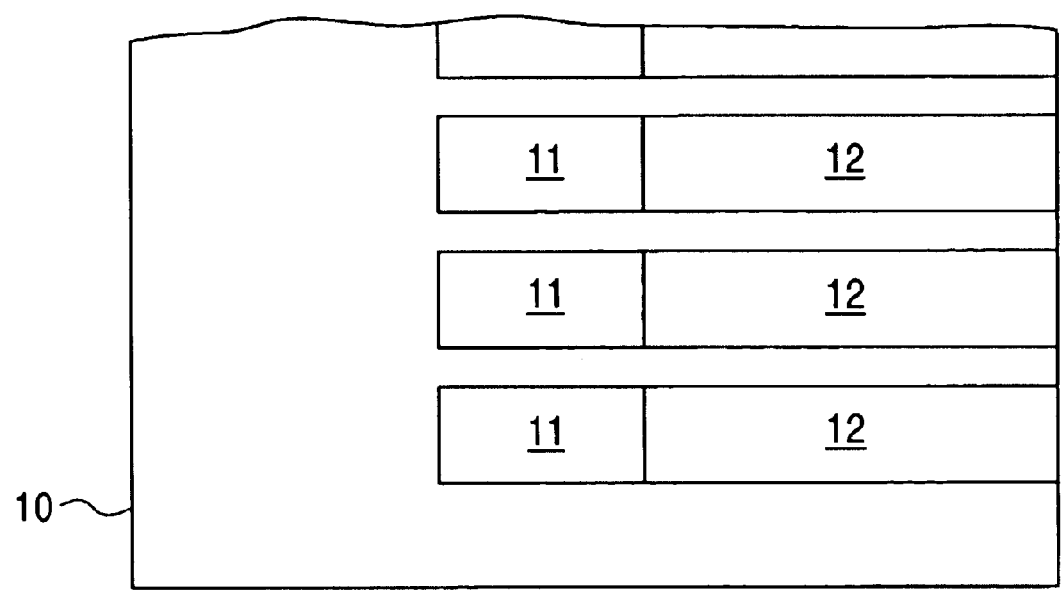

Next, as shown in FIG. 10, an electron supply layer 12 is formed through etching on each of the bottom electrode surface 11 thus fabricated such that it extends along the bottom electrode 11 except a region of the same which is to serve as pickup section or a first external repeating terminal 18 later.

Figure 11:
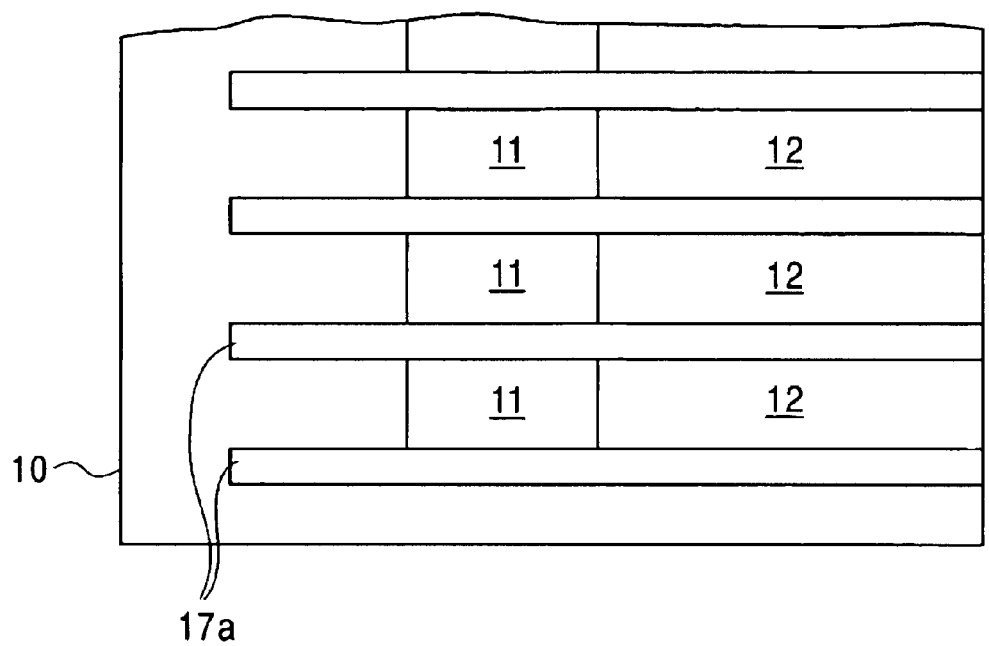

Next, as shown in FIG. 11, first insulating protective films 17a are formed on precipice portions defined between the electron supply layers 12 in the form of stripes as a result of the formation of the bottom electrodes 11 and electron supply layers 12 and on the substrate 10 at the bottom of the same. The entire surface of the substrate 10 is covered by the first insulating protective films 17a. The thickness of the first insulating protective films 17a may be set at a value that is similar to or greater than the thickness up to the electron supply layer 12.

In this panel, the bus electrodes 16 which are arranged in parallel in the direction orthogonal to the direction of the bottom electrodes 11 must be formed at a later step. The breakage of the bus electrodes 16 located on the top of the panel attributable to the difference between the thicknesses of the bottom electrodes 11 and electron supply layers 12 is prevented by providing the first insulating protective films 17a.

Figure 12:
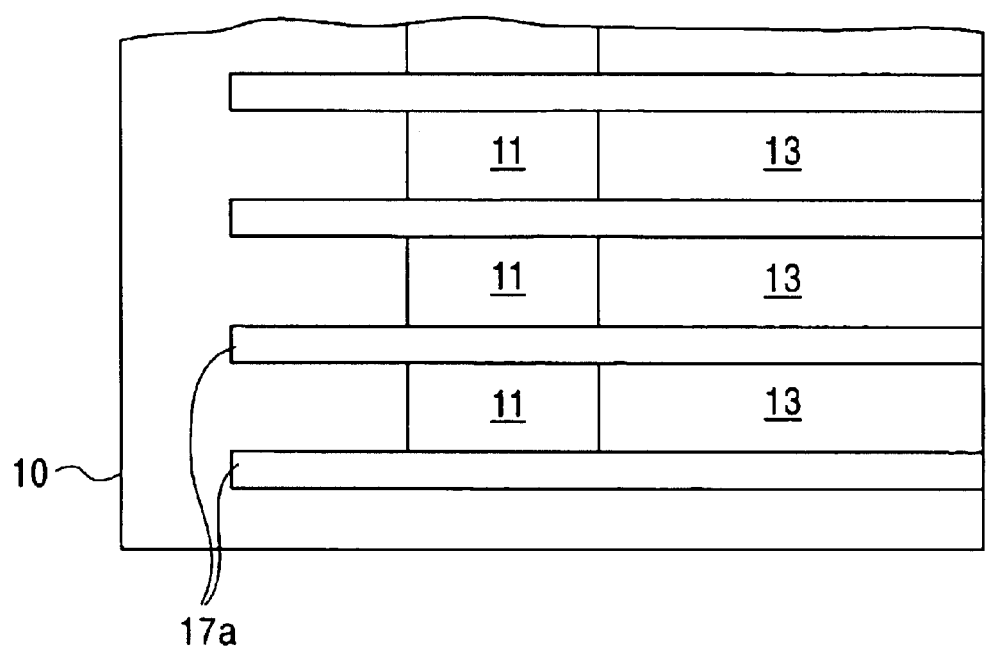

Next, as shown in FIG. 12, etching is performed to form the insulator layer 13 on each of the electron supply layer 12 such that it is defined along the electron supply layer.

Figure 13:
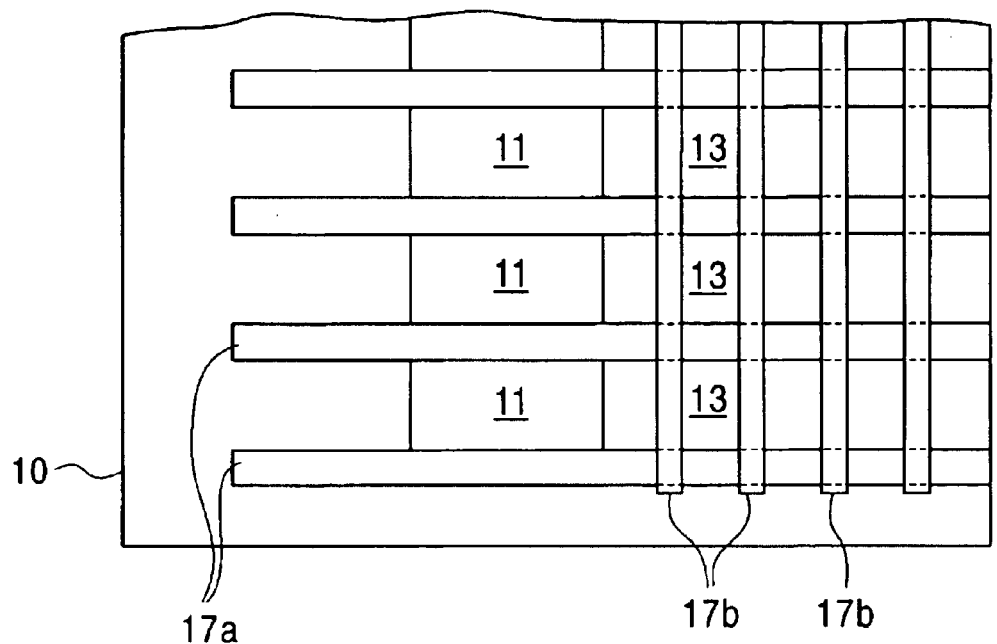

Next, as shown in FIG. 13, the second insulating protective films 17b for the bus electrodes to be formed at a later step are formed on the first insulating protective films 17a and the insulator layer 13 such that they extend in the direction orthogonal to the bottom electrodes. The insulator layer 13 is exposed between the second insulating protective films 17b to define electron emitting sections.

Figure 14:
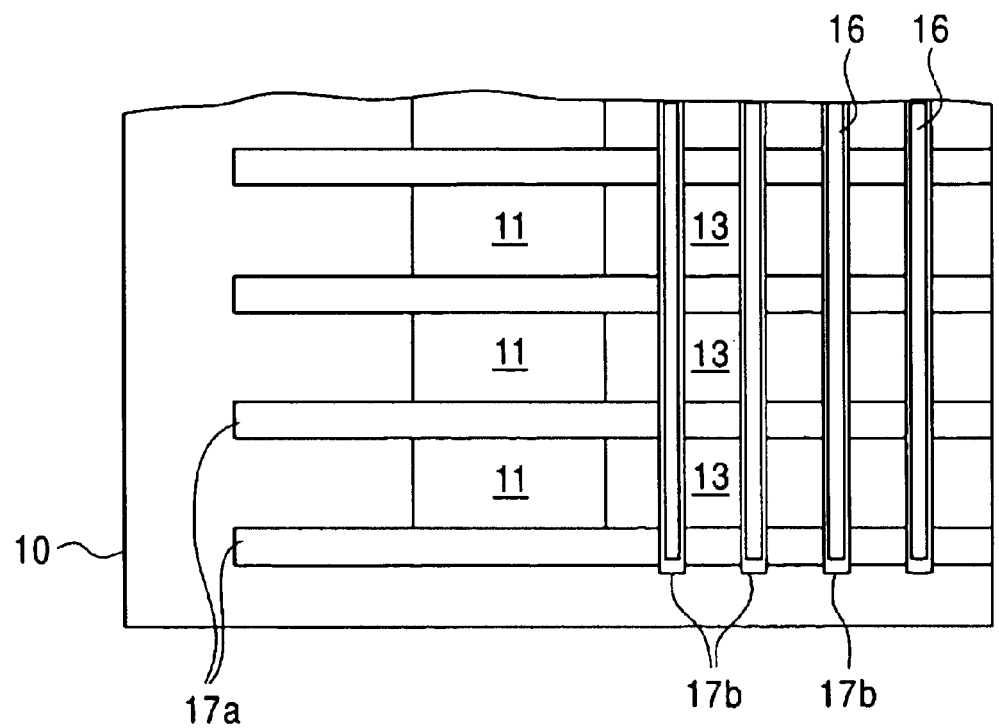

Next, as shown in FIG. 14, the bus electrodes 16 having a predetermined thickness are formed only on the second insulating protective films 17b such that they are defined along the same. That is, the width of the bus electrodes 16 is smaller than the width of the second insulating protective films 17b.

Figure 15:
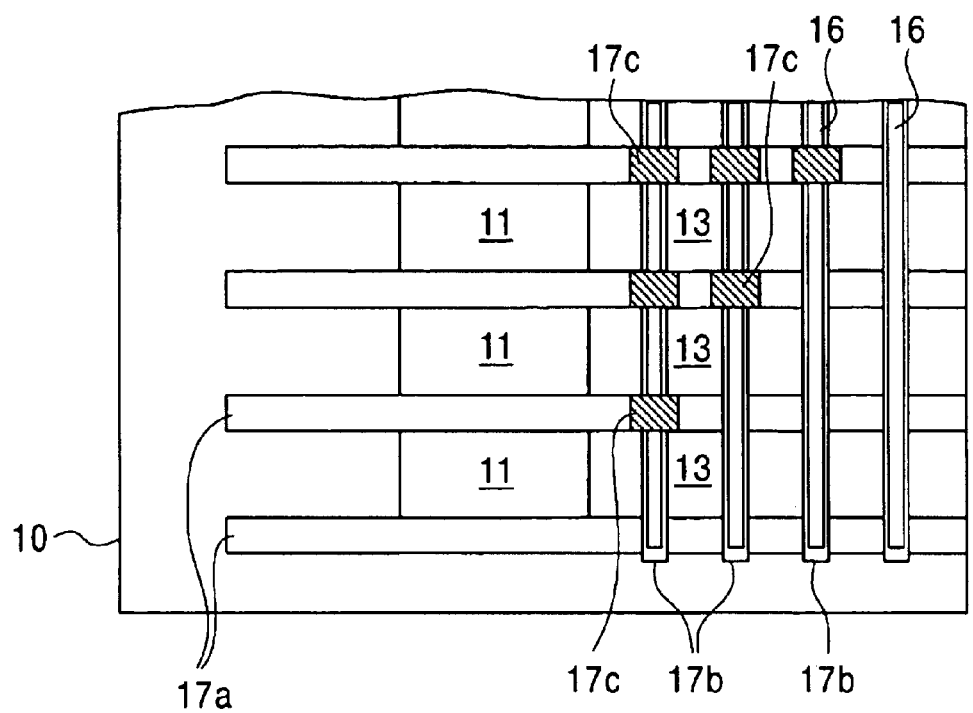

Next, as shown in FIG. 15, the third insulating protective films 17c are formed at intersections of the bus electrodes 16 which should not to be connected to the second external repeating terminals 19 to be connected at a later step.

Figure 16:
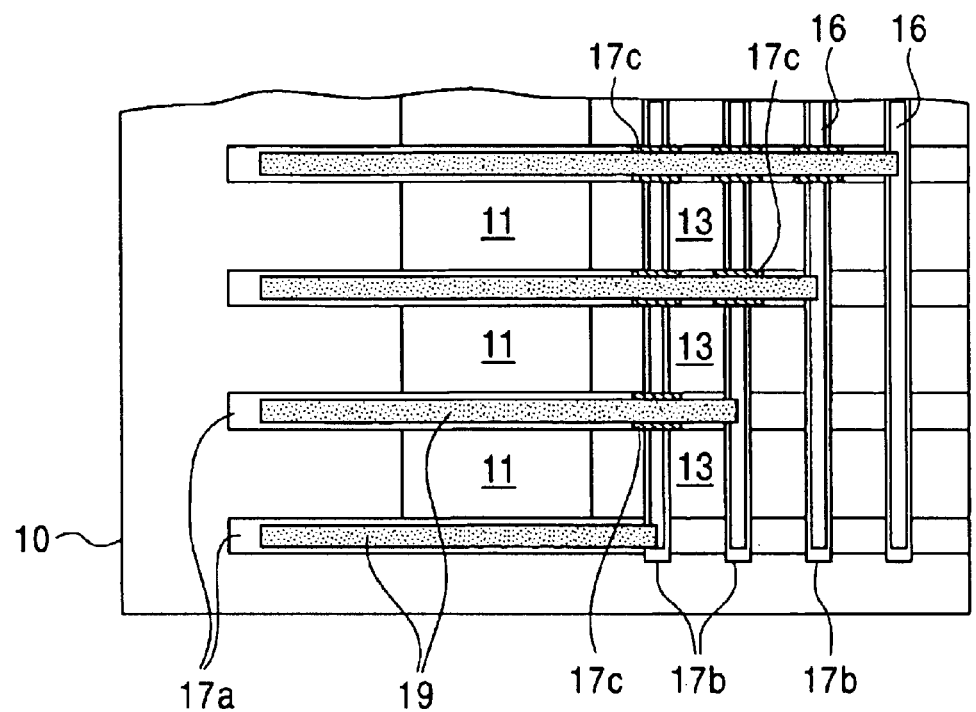

Next, as shown in FIG. 16, the second external repeating terminals 19 having a predetermined thickness are formed only on the first insulating protective films 17a and the third insulating protective films 17c on the bus electrodes 16 which should not be connected such that they are defined along those films. That is, the width of the second external repeating terminals 19 is smaller than the width of the first insulating protective films 17a and the third insulating protective films 17c. Ends of predetermined second external repeating terminals 19 are connected only to predetermined bus electrodes 16.

Next, as shown in FIG. 5, the top electrodes 15 are formed as individual electrodes in the form of islands to be linked by the bus electrodes 16. Each of the top electrodes 15 is formed across the bus electrodes 16, second insulating protective films 17b, and insulator layer 13 such that a major part of the same is located on a flat surface of the insulator layer 13 and such that an edge of the same covers a part of a bus electrode 16. Since such a panel structure allows the first and second electrodes to be picked up at one side of the panel, electrodes including acceleration electrodes can be taken out only on two sides of panels, which makes it easy to assemble the panels into a unit. The first insulating protective films 17a isolate the bus electrodes 16 and isolate adjoining devices from each other, and the second insulating protective films 17b isolate the bus electrodes 16 from the insulator layer 13. Since the distance from the electron supply layer 12 to the top electrode 15 in a region where the second insulating protective film 17b is formed is greater than a similar distance in a region where no second insulating protective film 17b is formed, it is possible to prevent a leak current from the bottom of the bus electrodes 16 and the bottom of the top electrodes 15 on the way to the emitting section.

The front-side substrate is fabricated by forming the transparent collector electrodes 2 on the transparent front-side substrate 1 made of glass or the like. While any material exhibiting high transmittance against visible light and a low electrical resistance may be used as the transparent collector electrodes 2, in particular, ITO is the optimum material. The transparent collector electrodes 2 are formed on the entire surface of the front-side substrate to a thickness of 0.4 µm.

Referring now to a combining step, the backside substrate and front-side substrate thus fabricated are combined such that a partition wall (not shown) on the backside substrate 10 and a second partition wall (not shown) on the front-side substrate 1 are in contact with each other and such that the two substrates face each other with the vacuum space 4 sandwiched therebetween; the substrates are sealed at the periphery thereof; evacuation is carried out between the two substrates; and a getter provided therein is thereafter scattered through induction heating; and the exhaust port is finally sealed.

The bottom electrodes and bus electrodes on the backside substrate are respectively connected to the ground and a positive voltage, and the transparent electrodes on the front-side substrate are connected to a positive voltage of a few kV, to complete a flat panel display device consisting of a pair of a transparent front-side substrate 1 and a backside substrate 10 as shown in FIG. 4.

(Another Embodiment)

Figure 17:
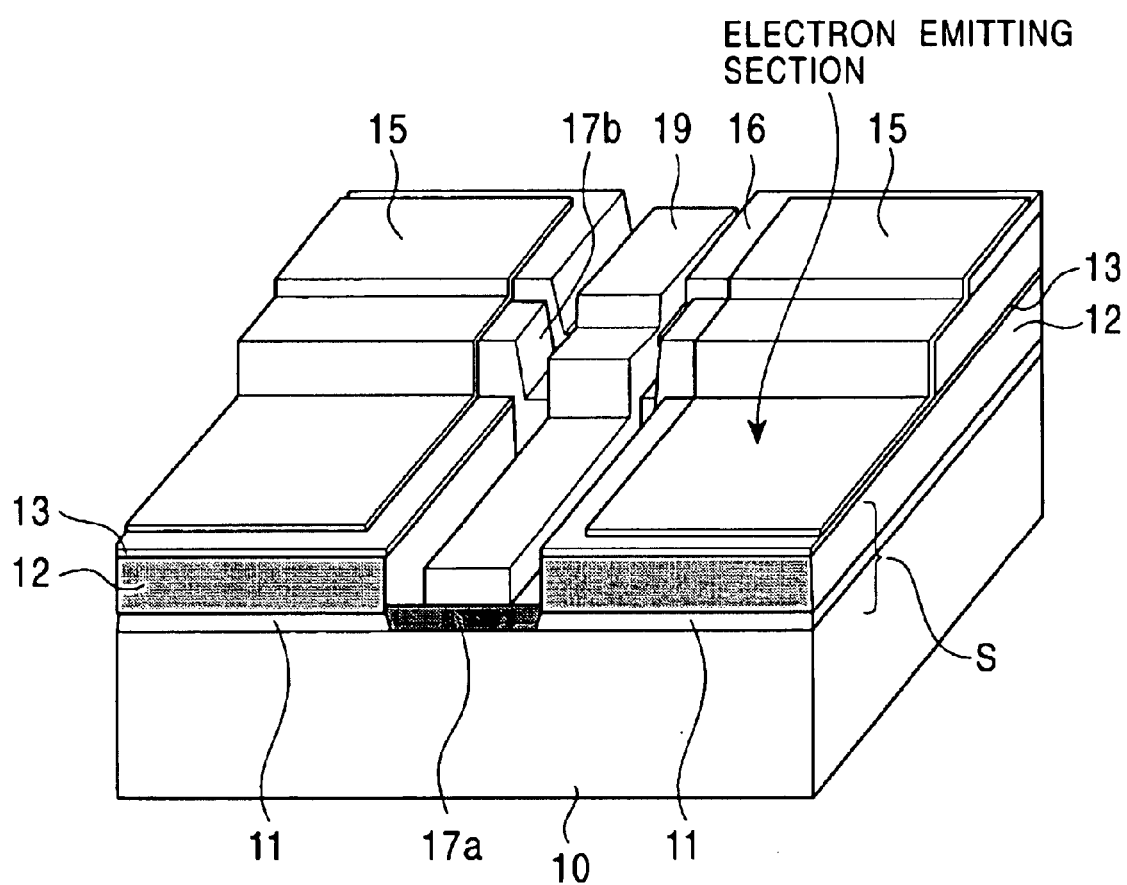
FIG. 17 is a schematic perspective view partly enlarged showing a part of a substrate at a step of manufacturing a flat panel display device utilizing electron emission devices according to another embodiment of the invention.

The thickness of the first insulating protective films 17a in the above-described embodiment may be set at a value that is similar to or greater than the thickness up to the electron supply layer 12 as shown in FIG. 6, this is not limiting the present invention. For example, breakage of the bus electrodes can be avoided if the films have a thickness that is 5% or more of the thickness of the electron emission sites as shown in FIG. 17. Therefore, the thickness of the first insulating protective films is preferably 5% or more of the thickness of the devices as a whole (about 6 µm) (the upper liming being a thickness that is substantially equal to the height of the device insulator layer 13). The lower limit for the thickness of the first insulating protective films 17a is a thickness which does not cause breakage of the bus electrodes.

Figure 18:
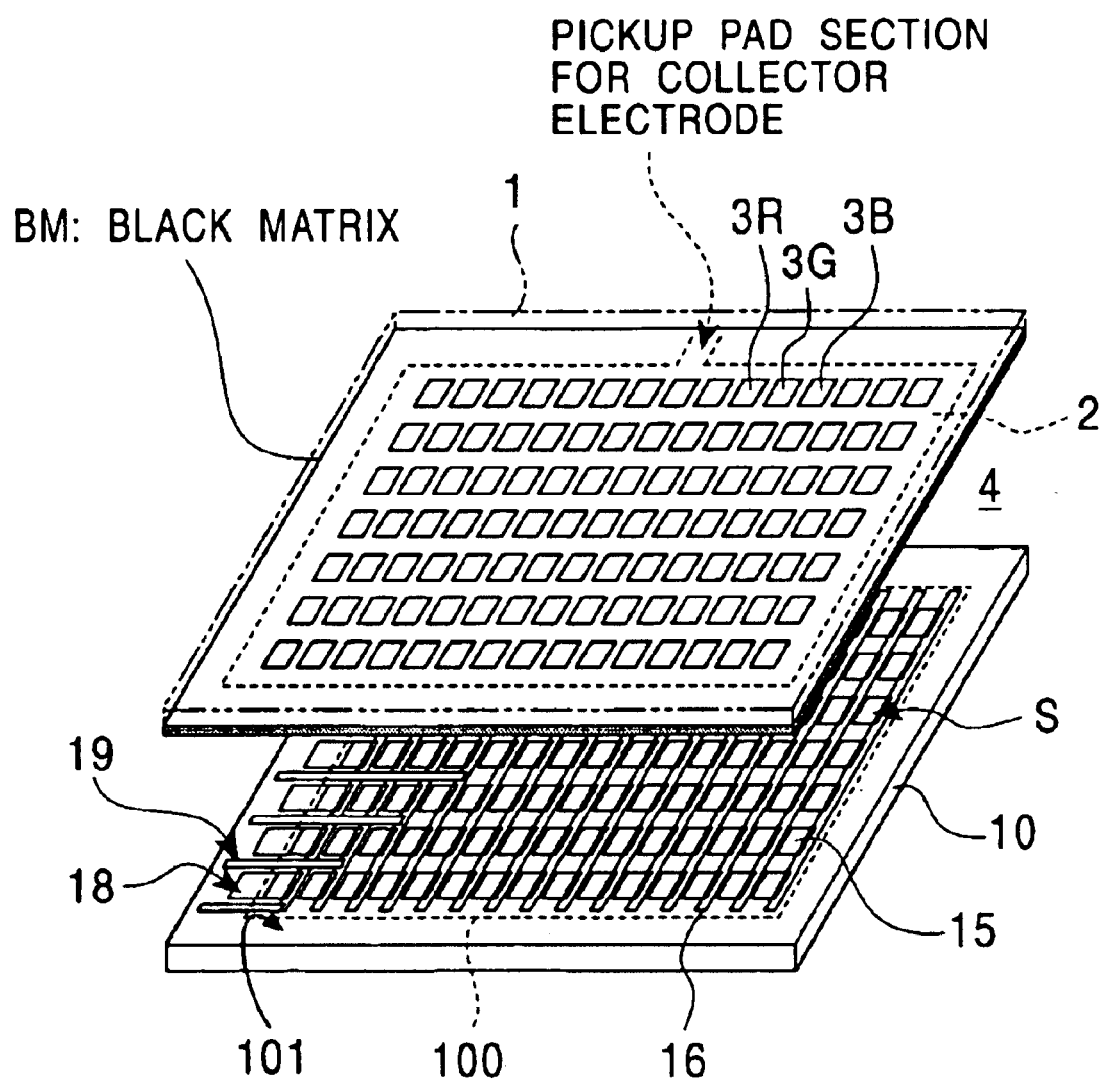
FIG. 18 is a schematic enlarged perspective view of a part of a substrate at a step of manufacturing a flat panel display device utilizing electron emission devices according to another embodiment of the invention.

While the transparent collector electrodes 2 made of ITO or the like are directly formed on the transparent front-side substrate 1 made of glass or the like in the above-described embodiment as shown in FIG. 4, this is not limiting the invention. For example, according to a still another embodiment of the invention, luminescent material layers 3R, 3G, and 3B respectively emitting red, green, and blue light may be provided in regions defined by a black matrix BM made of carbon or the like on an inner surface of a front-side substrate 1, and conductor layers made of Al or the like may be provided on the inner surface to be used as collector electrodes 2 as shown in FIG. 18. While an image display array constituted by a plurality of light-emitting sections associated with the luminescent material layers 3R, 3G, and 3B is defined by the matrix layer BM in a dark color or black, they may be similarly defined using a stripe layer in a dark color or black. In either case, there is provided a flat panel display device utilizing electron emission sites having an image display array constituted by a plurality of light-emitting sections associated with the luminescent material layers.

SPECIFIC EXAMPLE

A flat panel display device was actually fabricated with specifications (1) through (6) as shown below using a sputtering process for film formation and then characteristics of the same were examined.

(1) Bottom electrodes: Cr, Cu, and Cr films having thicknesses of 50 nm, 1 µm, and 100 nm, respectively.

(2) Semiconductor electron supply layer: Si layer having a thickness of 4 µm.

(3) Insulator layer: $SiO_x$ layer having a thickness of 330 nm.

(4) Top electrode: Pt film having a thickness of 40 nm.

(5) Bus electrodes: Cr, Cu, and Cr films having thicknesses of 50 nm, 1 μm, and 100 nm, respectively.

(6) Second external repeating terminals: Cr, Cu, and Cr films having thicknesses of 50 nm, 1 μm, and 100 nm, respectively.

(7) First, second, and third insulating protective films: $SiO_x$ films having a thickness of 350 nm.

The bottom electrodes (1) and semiconductor electron supply layers (2) were formed in the form of lines on a glass substrate which had been cleaned. Thereafter, the first insulating protective films (7) were formed between the lines. Next, the insulator layers (3) were formed on the semiconductor electron supply layers (2) in the form of lines such that they are defined along the same. Next, the second insulating protective films (7) were formed on the first insulating protective films (7) and the insulator layers (3) in the form of line orthogonal thereto. Those protective films formed a grid configuration constituted by regions orthogonal to the bottom electrodes (1) and regions extending between the bottom electrodes (1) in parallel therewith, and the parallel regions covered precipice portions formed between the bottom electrodes (1) and the semiconductor layers (2).

Next, the bus electrodes (5) were formed on the second insulating protective films (7) orthogonal to the bottom electrodes (1) such that they were defined along the same.

Next, the third insulating protective films (7) were formed on regions of the bus electrodes (5) which would intersect with the second external repeating terminals 19 (2) to be formed at the next step, Next, the second external repeating terminals (6) were formed on the first insulating protective films (7) between the bottom electrodes (1) and on the predetermined regions on the bus electrodes (5) such that they are connected to each of the bus electrodes in an orthogonal relationship.

The top electrode (4) was formed for each of the light-emitting sections such that it covers a flat region of the semiconductor electron supply layer (2) and a part of the bus electrode (5). The glass (backside) substrate formed with an emission site comprised of a plurality of electron emission sites and a separately fabricated front-side substrate applied with luminescent materials serving as pixels capable of emitting R, G, and B light were disposed such that they sandwich spacers made of glass. They are heated and bonded together in a high level of vacuum of $1 \times 10^{-7}$ torr to form a panel. A high level of vacuum was maintained inside the panel using a non-evaporating getter.

A voltage of 5 kV as an acceleration voltage was applied to the flat panel display device thus fabricated, and electrical characteristics, i.e., a driving voltage, a device current, and an emission current were examined.

Figure 19:
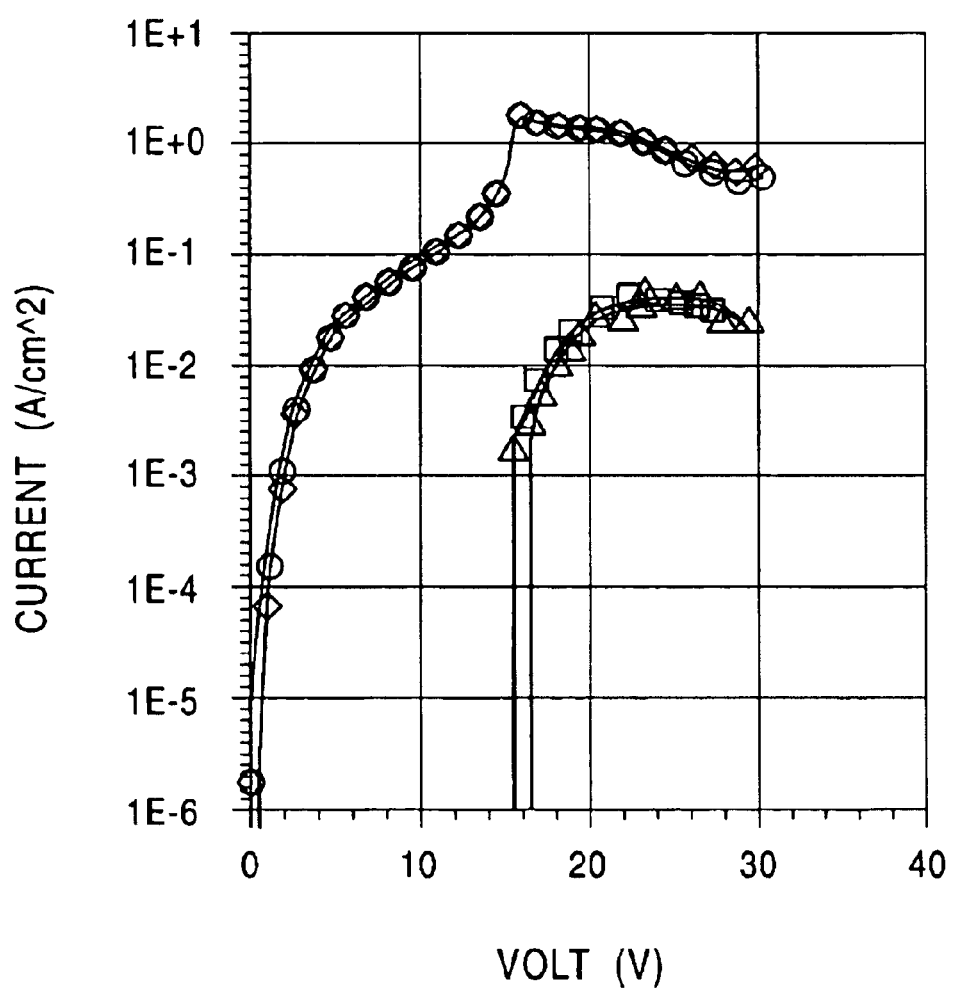
FIG. 19 is a graph showing electrical characteristics, i.e., a driving voltage, a device current, and an emission current of a flat panel display device utilizing electron emission devices according to an embodiment of the invention.

As a result of the evaluation of the electrical characteristics, it was confirmed that the display device had characteristics equivalent to those of the characteristics of conventional devices as shown in FIG. 19.

Figure 20:
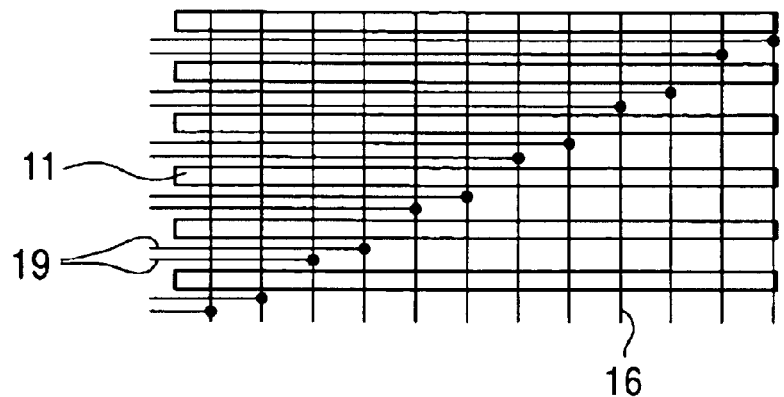
FIG. 20 is a schematic view showing a part of a flat panel display device utilizing electron emission devices according to another embodiment of the invention.

Referring to the number of second external repeating terminals 19 formed between a pair of bottom electrodes 11, while a single terminal will be sufficient when the total number of the bottom electrodes 11 picked up from the matrix agrees with the total number of the top electrodes 15 picked up from the same, if a greater number of top electrodes 15 are picked up, the number of the second external repeating terminals 19 formed between a pair of bottom electrodes 11 may be increased according to the number of the top electrodes. For example, as apparent from FIG. 20 that is a schematic view showing only the bottom electrodes 11, bus electrodes 16, and the second external repeating terminals 19, two second external repeating terminals 19 may be provided between each pair of adjoining bus electrodes 16.

(Still Another Embodiment)

While the emission sites formed between the top and bottom electrodes are electron emission sites in the above embodiments, the scope of the invention includes a flat panel display device constituted by a plurality of organic EL devices having at least one layer of an organic EL medium and second electrodes formed in the same order on first electrodes instead of electron emission sites.

Figure 21:
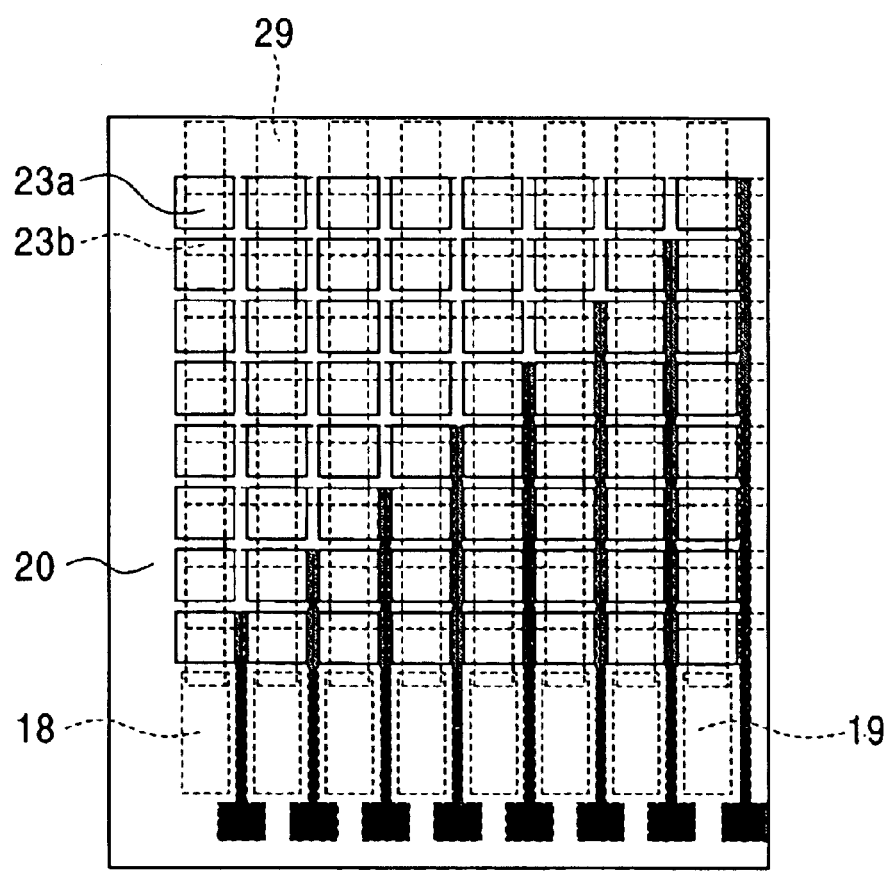
FIG. 21 is a partially cutaway schematic enlarged plan view showing a part of an organic EL display device panel according to the invention as viewed from a substrate thereof.
Figure 22:
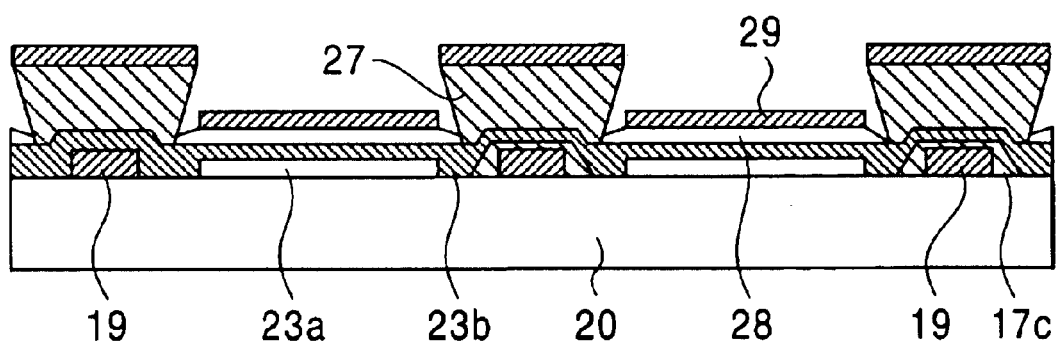
FIG. 22 is a schematic enlarged sectional view of a part of a substrate at a step of manufacturing an organic EL display device panel according to an embodiment of the invention.

FIG. 21 is a partially cutaway schematic enlarged plan view of a part of a flat panel display device constituted by a plurality of organic EL devices according to the invention as viewed from a substrate thereof. As apparent from the partial enlarged sectional view shown in FIG. 22, such a flat panel display device is manufactured as follows.

A transparent substrate 20 made of glass or the like is provided, and a plurality of island-shaped transparent electrodes 23a made of a material having a high work function such as ITO are formed on a principal surface thereof in the form of a matrix to serve as an image display array region. Next, metal anode bus lines 23b for electrically connecting the island-shaped transparent electrodes 23a in the horizontal direction are formed through vacuum deposition or the like. Next, steps similar to those shown in FIGS. 14 and 15 for explaining the above embodiments are performed to branch a second external repeating terminal 19 from each of the anode bus lines such that it extends perpendicularly to the anode bus line 23b and such that it is located between a pair of island-shaped transparent electrodes. Next, a plurality of partition walls 27 having electrical insulating properties are formed on the second external repeating terminals 19 to cover the same. Referring now to the formation of organic light-emitting layers for example, a deposition process utilizing a predetermined mask is performed to form an organic EL medium 28 having a predetermined thickness on ITO electrodes 23 exposed between the partition walls 27.

Cathodes of a plurality of second display electrodes 29 are formed through deposition or the like on the thin films of the organic EL medium such that they expend perpendicularly thereto to define a light-emitting section at each of intersections of the same with the first display electrodes.

Sections of the organic EL medium 28 thus surrounded by the first and second display electrodes intersecting each other correspond to the light-emitting sections. In the organic EL display panel of the present embodiment, the substrate and the first display electrodes are transparent, and light is emitted from the substrate. In another embodiment of an organic EL display panel, the second display electrodes may conversely be formed from a transparent material to emit light from the second display electrodes. A conductor film is formed on the second electrode films, and an anti-humidity process and sealing is thereafter performed to complete the organic EL display panel.

Further, the present invention may be applied to a plasma display device which is a flat panel display device comprising an emitting region constituted by a plurality of first electrodes provided on a substrate and extending in parallel, a plurality of second electrodes provided on the first electrodes and extending substantially perpendicularly to the first electrodes, and a plurality of emission sites for emitting ultraviolet light respectively connected to a plurality of intersections between the first and second electrodes and arranged on the substrate and comprising a peripheral region surrounding the emitting region on the substrate, the display device having a plurality of first external repeating terminals which are formed by extending either of the first and second electrodes and collectively arranging them side by side in a part of the peripheral region and a plurality of second external repeating terminals which are respectively connected to the remaining group of electrodes, i.e., the first or second electrodes in the emitting region and arranged side by side along the first external repeating terminals.

As described above, the invention is different from the conventional methods for picking up electrodes from FEDs in which electrode pickup sections are undesirably overlap each other when the FEDs are assembled into a unit in that the panel structure according to the invention makes it possible to assemble a unit easily because electrodes can be picked up on two sides of panels.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese Patent Application No. 2000-401724 which is hereby incorporated by reference.

What is claimed is:

1. A display device of flat panel structure with emission devices of matrix array comprising:
    an emitting region including:
        a plurality of first electrodes provided on a substrate and extending in parallel with each other,
        a plurality of second electrodes extending in parallel with each other which are provided over said first electrodes to extend perpendicular to said first electrodes, and
        a plurality of emission sites for emitting electrons or light respectively connected to a plurality of intersections between the respective first and second electrodes and arranged over said substrate; and
    a peripheral region surrounding said emitting region on said substrate,
    first external repeating terminals provided on ends of said first electrodes respectively; and
    respective second external repeating terminals extending from a part of the peripheral region between respective pairs of adjacent first electrodes and connected to said second electrodes in said emitting region so that said respective second external repeating terminals are alternatingly arranged with the first electrodes, whereby the first and second external repeating terminals alternatingly provided in the part of said peripheral region.

2. A display device according to claim 1, wherein said substrate is a backside substrate; said first electrodes are bottom electrodes; said emission sites are electron emission sites having insulator layers formed on said bottom electrodes and top electrodes; and said second electrodes are connected to said top electrodes, the display device comprising a transparent front-side substrate which faces said top electrodes of said electron emission sites on said backside substrate with a vacuum space sandwiched therebetween.

3. A display device according to claim 2, wherein said electron emission sites have electron supply layers comprising a metal or semiconductor provided between said bottom electrodes and said insulator layers.

4. A display device according to claim 2, wherein said front-side substrate has collector electrodes formed on a surface thereof toward said vacuum space and luminescent layers formed on said collector electrodes.

5. A display device according to claim 2, wherein said front-side substrate has luminescent layers formed on a surface thereof toward said vacuum space and collector electrodes formed on said luminescent layers.

6. A display device according to claim 2, further comprising insulating protective films provided between said second electrodes and said insulator layers and between said second electrodes and said backside substrate.

7. A display device according to claim 2, further comprising insulating protective films provided between said first electrodes and said second electrodes at intersections between said first electrodes and said second electrodes.

8. A display device according to claim 1, wherein said emission sites are organic electroluminescence devices having one or more layers of an organic electroluminescence medium sequentially formed between said first and second electrodes.

9. A display device according to claim 8, wherein said substrate and said first electrodes are transparent.

10. A display device according to claim 8, wherein said first electrodes comprise a plurality of transparent electrodes associated with each of said organic electroluminescence devices and a metal bus line for electrically connecting said transparent electrodes.

11. A display device according to claim 8, wherein said second electrodes are transparent.

12. A display device according to claim 1,
    wherein said emitting region is in a rectangular configuration and wherein the first and second external repeating terminals collectively provided side by side in a part of said peripheral region are located on one side of said rectangle.

13. A display device according to any of claims 1 through 3, wherein said first and second external repeating terminals have an external terminal exposed to the outside.

14. A display device of flat panel structure with emission devices of matrix array comprising:
    a plurality of first electrodes provided on a substrate and extending in parallel with each other;
    a plurality of second electrodes extending in parallel with each other which are provided over said first electrodes to extend perpendicular to said first electrodes;
    a plurality of emission sites for emitting electrons or light respectively connected to a plurality of intersections between the respective first and second electrodes and arranged over said substrate; and
    respective second external repeating terminals branching off from the second electrodes between respective pairs of adjacent first electrodes and extending therebetween so that the second external repeating terminals and the first electrodes are alternately arranged.

15. A display device according to claim 14, wherein each of said respective second external repeating terminals branches from the second electrode in a form of a letter "T".

16. A display device according to claim 14, further comprising first external repeating terminals provided on ends of said first electrodes and wherein said first and second external repeating terminals are alternatingly arranged.

17. A display device according to claim 14, wherein said substrate is a backside substrate; said first electrodes are bottom electrodes; said emission sites are electron emission sites having insulator layers formed on said bottom electrodes and top electrodes; and said second electrodes are connected to said top electrodes, the display device comprising a transparent front-side substrate which faces said top electrodes of said electron emission sites on said backside substrate with a vacuum space sandwiched therebetween.

18. A display device according to claim 17, wherein said electron emission sites have electron supply layers comprising a metal or semiconductor provided between said bottom electrodes and said insulator layers.

19. A display device according to claim 17, wherein said front-side substrate has collector electrodes formed on a surface thereof toward said vacuum space and luminescent layers formed on said collector electrodes.

20. A display device according to claim 17, wherein said front-side substrate has luminescent layers formed on a surface thereof toward said vacuum space and collector electrodes formed on said luminescent layers.

21. A display device according to claim 17, further comprising insulating protective films provided between said second electrodes and said insulator layers and between said second electrodes and said backside substrate.

22. A display device according to claim 17, further comprising insulating protective films provided between said first electrodes and said second electrodes at intersections between said first electrodes and said second electrodes.

23. A display device according to claim 14, wherein said emission sites are organic electroluminescence devices having one or more layers of an organic electroluminescence medium sequentially formed between said first and second electrodes.

24. A display device according to claim 23, wherein said substrate and said first electrodes are transparent.

25. A display device according to claim 23, wherein said first electrodes comprise a plurality of transparent electrodes associated with each of said organic electroluminescence devices and a metal bus line for electrically connecting said transparent electrodes.

26. A display device according o claim 23, wherein said second electrodes are transparent.

27. A display device according to claim 15, wherein the first and second external repeating terminals collectively provided side by side in a part of said peripheral region are located on one side of said rectangle.

28. A display device according to claim 15, wherein said first and second external repeating terminals have an external terminal exposed to the outside.

29. An emission flat panel structure with emission devices of matrix array comprising:
   a plurality of first electrodes provided on a substrate and extending in parallel with each other;
   a plurality of second electrodes extending in parallel with each other which are provided over said first electrodes to extend perpendicular to said first electrodes;
   a plurality of emission sites for emitting electrons or light respectively connected to a plurality of intersections between the respective first and second electrodes and arranged over said substrate; and
   respective second external repeating terminals branching off from the second electrodes between respective pairs of adjacent first electrodes and extending therebetween so that the second external repeating terminals and the first electrodes are alternately arranged.

30. An emission flat panel structure according to claim 29, wherein each of said respective second external repeating terminals branches from the second electrode in a form of a letter "T."

31. An emission flat panel structure according to claim 29, further comprising first external repeating terminals provided on ends of said first electrodes and wherein said first and second external repeating terminals are alternately arranged.

32. An emission flat panel structure according to claim 29, wherein said emission sites are electron emission devices each comprising an insulator layer formed on said first electrode; and a top electrode formed on the insulator layer and connected to said second electrode.

33. An emission flat panel structure according to claim 32, wherein each of said electron emission devices further comprises an electron supply layer including a metal or semiconductor provided between said first electrode and said insulator layer.

34. An emission flat panel structure according to claim 32, further comprising insulating protective films provided between said second electrodes and said insulator layers and between said second electrodes and said substrate.

35. An emission flat panel structure according to claim 32, further comprising insulating protective films provided between said first electrodes and said second electrodes at intersections between said first electrodes and said second electrodes.

* * * * *